US012796488B2

(12) United States Patent
Mazzola

(10) Patent No.: US 12,796,488 B2
(45) Date of Patent: Nov. 10, 2026

(54) METHOD OF MANUFACTURING SEMICONDUCTOR DEVICES, CORRESPONDING PRE-MOLDED LEADFRAME AND SEMICONDUCTOR DEVICE

(71) Applicant: STMicroelectronics International N.V., Geneva (CH)

(72) Inventor: Mauro Mazzola, Calvenzano (IT)

(73) Assignee: STMicroelectronics International N.V., Geneva (CH)

( * ) Notice: Subject to any disclaimer, the term of this patent is extended or adjusted under 35 U.S.C. 154(b) by 308 days.

(21) Appl. No.: 18/756,344

(22) Filed: Jun. 27, 2024

(65) Prior Publication Data

US 2025/0014982 A1 Jan. 9, 2025

(30) Foreign Application Priority Data

Jul. 5, 2023 (IT) ........................ 102023000014049

(51) Int. Cl.

| | |
|---|---|
| ***H10W 70/40*** | (2026.01) |
| ***H10W 70/04*** | (2026.01) |
| ***H10W 74/01*** | (2026.01) |

(52) U.S. Cl.

CPC ....... *H10W 70/479* (2026.01); *H10W 70/042* (2026.01); *H10W 70/411* (2026.01); *H10W 70/421* (2026.01); *H10W 74/016* (2026.01)

(58) Field of Classification Search

CPC .................................................. H10W 70/479

See application file for complete search history.

(56) References Cited

U.S. PATENT DOCUMENTS 6,329,706 B1 * 12/2001 Nam .................. H10W 70/411 257/676
10,090,228 B1 * 10/2018 Kim .................... H10W 70/042
2009/0079048 A1 * 3/2009 Badakere Govindaiah ................. H10W 70/411 257/670
2022/0115245 A1 * 4/2022 Narayanasamy ..... H10W 70/04
2023/0343684 A1 * 10/2023 Kikuchi .............. H10W 70/411

FOREIGN PATENT DOCUMENTS

EP 4113601 A1 1/2023
JP 2018064062 A 4/2018

OTHER PUBLICATIONS

IT Search Report and Written Opinion for priority application, IT Appl. No. 102023000014049, report dated Jan. 30, 2024, 8 pgs.

* cited by examiner

*Primary Examiner* — Ali Naraghi
(74) *Attorney, Agent, or Firm* — Crowe & Dunlevy LLC

(57) ABSTRACT

Electrically insulating material is molded onto a sculptured, electrically conductive leadframe structure that includes a pattern of electrically conductive formations such as a die mounting location configured to have at least one semiconductor die arranged thereon, a dummy pad and a tie bar extending between the die mounting location and the dummy pad. A pre-molded leadframe structure results from the electrically insulating material penetrating into spaces between electrically conductive formations in the pattern of electrically conductive formations. At least one portion of the tie bar extending between the die mounting location and the dummy pad is removed to electrically decouple the dummy pad from the die mounting location.

11 Claims, 5 Drawing Sheets

METHOD OF MANUFACTURING SEMICONDUCTOR DEVICES, CORRESPONDING PRE-MOLDED LEADFRAME AND SEMICONDUCTOR DEVICE

PRIORITY CLAIM

This application claims the priority benefit of Italian Application for Patent No. 102023000014049 filed on Jul. 5, 2023, the content of which is hereby incorporated by reference in its entirety to the maximum extent allowable by law.

TECHNICAL FIELD

The description relates to manufacturing semiconductor devices.

Solutions as described herein can be applied to power (integrated circuit) semiconductor devices such as power quad flat no leads (QFN) packages used, for instance, for automotive products.

BACKGROUND

Integrated circuit semiconductor devices are conventionally mounted, via soldering, for instance, to a substrate, such as a printed circuit board (PCB).

In order to increase the reliability of solder joints, dummy pads may be provided at the bottom surface of the device, in addition to the leads providing input/output connections to the device.

In leadframe based packages, dummy pads may be provided at tie bars, bridge-like formations providing mechanical support to a die pad during processing. Tie bars are of the same electrically conductive material of the leadframe and thus provide an undesired electrical coupling between the dummy pads and the die pad.

Moreover, in certain cases the distance between a dummy pad and a lead, such as an input/output lead, may be relatively short due, for instance, to the relatively high number of leads of the device and/or the reduced dimensions of the device.

A short distance between the lead and the dummy pad may increase the risk of electrical discharge when high voltage differences are involved, such as in power devices operating at high voltage, for instance.

Such an electrical discharge may damage the device in so far as the dummy pads are electrically coupled to the die pad (via the tie bars) and an electrical discharge between a lead and a dummy pad would affect also the die pad (and possibly the die mounted thereon) causing failure of the device.

Reference is made to United States Patent Application Publication Nos. 2008/00157301, 2022/00115303, and 2011/0244633, incorporated herein by reference, as exemplary of recent advances in semiconductor devices provided with dummy pads/leads.

There is need in the art for solutions which aim at addressing the issues discussed in the foregoing.

SUMMARY

One or more embodiments relate to a method.

One or more embodiments relate to a corresponding integrated circuit semiconductor device.

One or more embodiments relate to a pre-molded leadframe for use in such devices.

Solutions as described herein may advantageously be applied to manufacturing processes involving a pre-molded leadframe.

Solutions as described herein facilitate providing a pre-molded leadframe having dummy pads electrically decoupled from the die pads.

In solutions as described herein, the electrical coupling between the dummy pads and the die pad is removed.

In solutions as described herein, removing the electrical coupling between the die pad and the dummy pad leaves a trench/recessed portion in the pre-molded leadframe that may be filled with molding compound via a second molding step.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

For simplicity and ease of explanation, throughout this description, and unless the context indicates otherwise, like parts or elements are indicated in the various figures with like reference signs, and a corresponding description will not be repeated for each and every figure.

Figure 1:
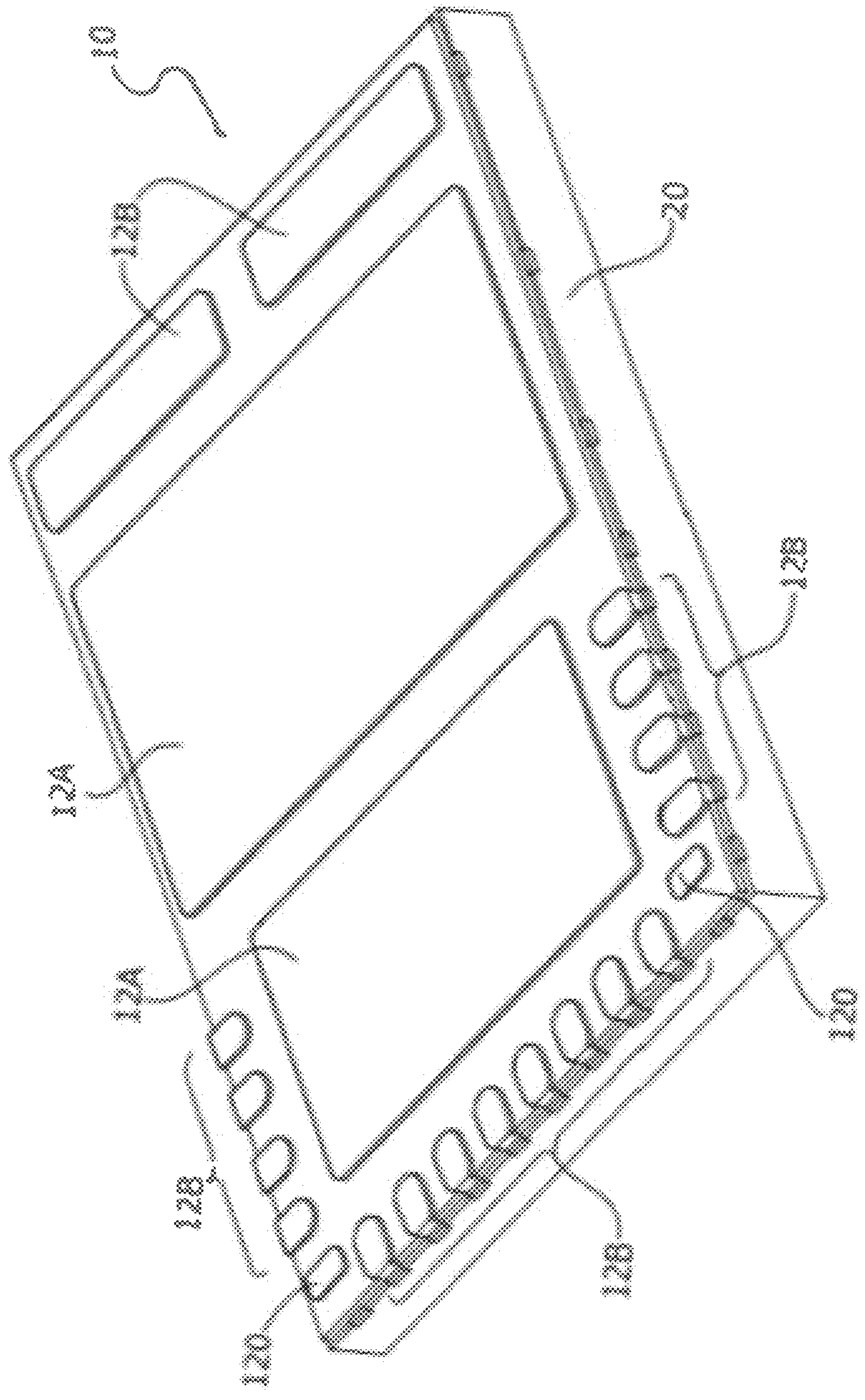
FIG. 1 is a perspective view of a semiconductor device provided with dummy pads.

FIG. 1 illustrates the back/bottom surface of a power integrated circuit (IC) semiconductor device 10 provided with a package of the type oftentimes referred to as Quad Flat No-Leads (QFN).

A device 10 as illustrated in FIG. 1 is configured to be mounted on a substrate such as a printed circuit board (PCB) for instance, by soldering the electrically conductive portions that are exposed at the bottom/back surface of the plastic (a cured epoxy resin, 20, for instance).

As illustrated, the electrically conductive regions may comprise: die mounting locations (die pads) 12A, having an (IC) semiconductor (silicon, for instance) die mounted on the front/top surface (not visible in the figure); leads 12B providing the desired input/output (I/O) electrical couplings to the device 10; and dummy pads 120, providing additional solder joints to the device 10.

"Dummy pads" or "dummy lead" is a common designation in the art for a pad/lead that is not used for providing input/output signals to a device. As mentioned, dummy pads 120 as considered herein may be provided with the purpose of enhancing reliability of the soldering, by providing additional solder joints to the device 10 for attachment to the PCB.

Figure 2:
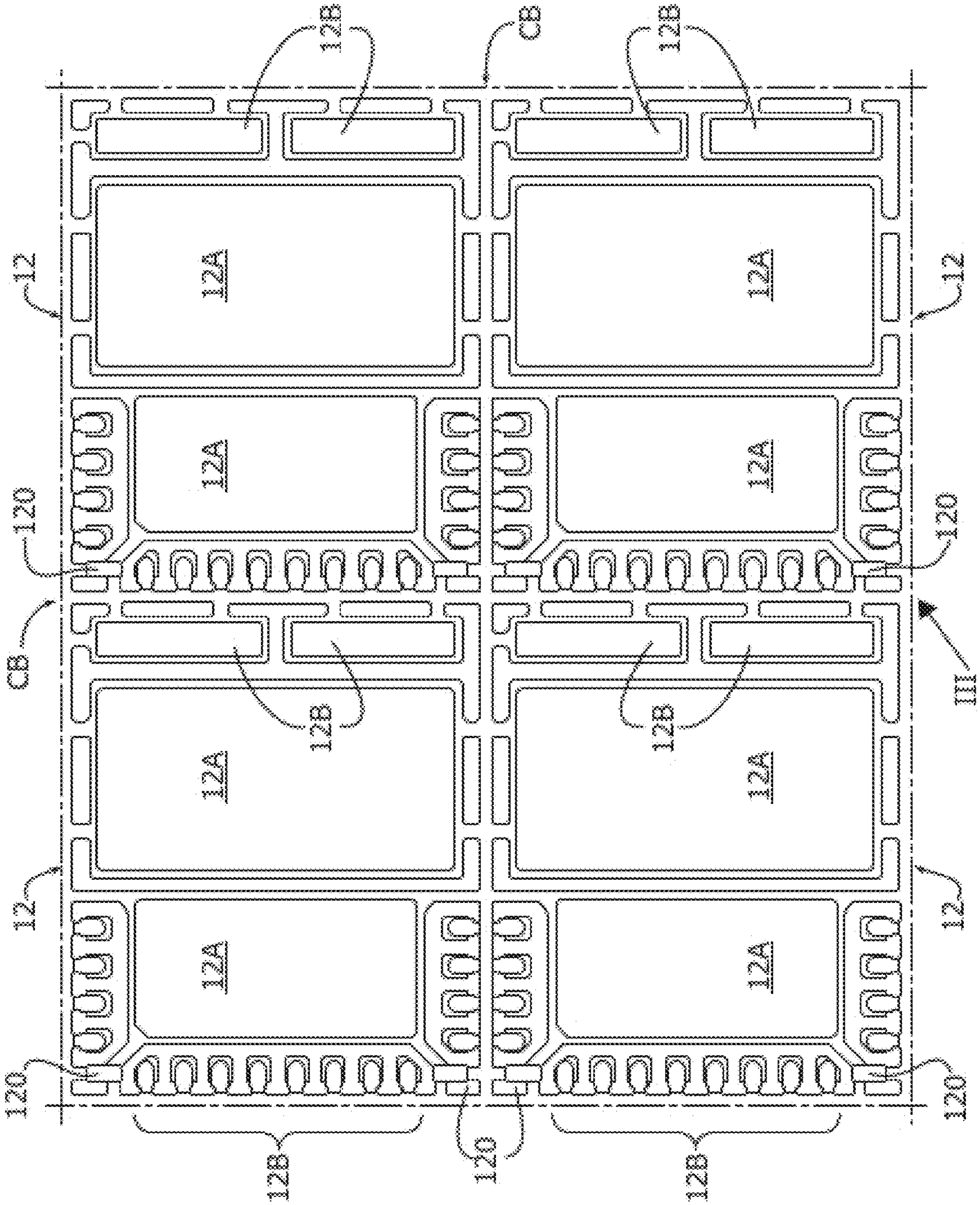
FIG. 2 is a plan view illustrative of a step in the manufacturing process of substrates for semiconductor devices.

FIG. 2 illustrates a step in the manufacturing process of a device as illustrated in FIG. 1, where a plurality of device substrates 12, conventionally referred to as leadframes, are held together in a leadframe strip/reel in order to facilitate concurrent processing of the plurality of leadframes 12.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Essentially, a leadframe 12 comprises an array of electrically-conductive formations (or leads, 12B) that from an outline location extend inwardly in the direction of a semiconductor chip or die (not visible in the figures) thus forming an array of electrically-conductive formations from a die pad 12A configured to have at least one (integrated circuit) semiconductor chip or die attached thereon. This may be via conventional means such as a die attach adhesive (a die attach film (DAF), for instance).

A leadframe can be of the pre-molded type, that is a type of leadframe comprising a sculptured metal (copper, for instance) structure formed by etching a metal sheet and comprising empty spaces that are filled by an insulating compound (a resin, for instance) "pre-molded" on the sculptured metal structure.

FIG. 2 illustrates portion of a leadframe strip/reel comprising four individual leadframes 12 held together via (sacrificial) connecting bars CB (also visible in the enlarged view of FIG. 3A) that run at the periphery of each individual leadframes 12. Connecting bars CB are removed in a final singulation step where a strip of processed devices 10 is cut (via sawing with a blade, for instance) to obtain a plurality of processed/finished individual devices 10.

Leadframes 12 as illustrated in the figures may be used as substrate in power (integrated circuit) semiconductor devices.

By way of example only, the leadframes 12 may comprise: a low-power section (on the left-hand side of each individual leadframe 12 of FIG. 2) that is, a first die pad 12A configured to host a controller die or chip; and a high-power section (on the right-hand side of each individual leadframe 12 of FIG. 2) that is, one or more die pads 12A configured to host one or more power integrated circuit dice or chips. As used herein, the terms chip/s and die/dice are regarded as synonymous.

Arrays of leads 12B are provided to the low-power and high-power sectors at the periphery of the device (respectively, on the left-hand and right-hand of each individual leadframe 12 illustrated in FIG. 2).

Figure 3B:
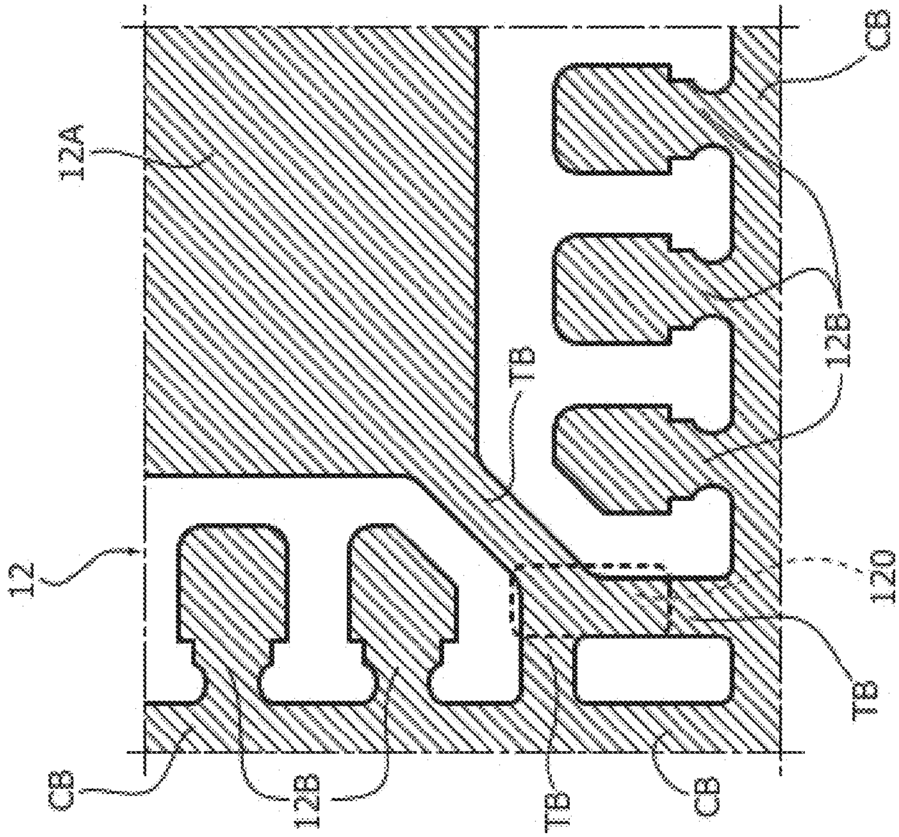
FIGS. 3A, 3B and FIGS. 4A, 4B are enlarged views of the portion of FIG. 2 indicated by the arrow III, illustrating the bottom (FIGS. 3A and 4A) and top (FIGS. 3B and 4B) surface of a substrate for semiconductor devices being processed.
Figure 3A:
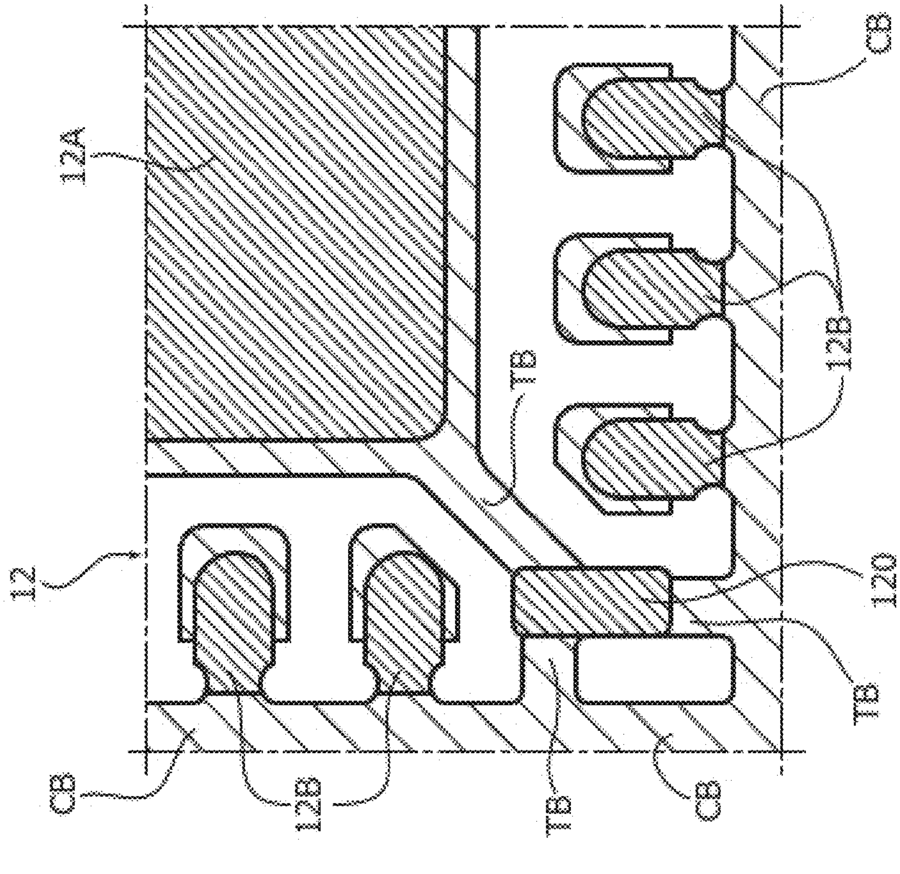

FIGS. 3A and 3B are illustrative of the bottom and top surfaces, respectively, of the leadframe portion (illustrated in an enlarged scale) indicated by the arrow III in FIG. 2.

As mentioned, leadframes 12 as illustrated may be provided via stamping or etching of an electrically conductive material such a metallic sheet, of copper, for instance, and, as illustrated in FIG. 3A, may comprise portions having different thicknesses, namely: "full" thickness, the central portions of the die pad 12A, leads 12B and the dummy pad 120 for instance; and "half" thickness, such as the tie bars TB and the connecting bars CB.

Portions of leadframe 12 having "half" thickness may be obtained by "half-etching" a sheet of electrically conductive material (of copper, for instance).

The term "half" is a common designation in the art, which does not imply that such partial etching or reduced thickness is by necessity to exactly half the thickness of the base sculptured structure of the leadframe.

Leadframes 12 may be connected to connecting bars CB via so-called tie bars TB, that is bridge-like formations which connect the die pads 12A (and/or the leads 12B) of a leadframe to the connecting bars.

Tie bars TB facilitate processing of leadframes 12 by keeping die pads 12A and leads 12B flat and in position during the pre-molding step, for instance, where a relatively strong pressure is applied to the leadframes 12.

As illustrated, dummy pads 120 may be provided at the tie bars TB connecting a die pad 12A to a (sacrificial) connecting bar CB and, as a result, is electrically coupled thereto.

The electrically conductive portions of a leadframe 12 as illustrated in FIG. 3 (that is, die pads 12A, leads 12B, tie bars TB and dummy pads 120) are separated by "empty" spaces therebetween.

In order to obtain a pre-molded leadframe 12, an insulating (pre-)molding compound (an epoxy resin, for instance) is molded onto the leadframes 12 of a leadframe strip causing the molding compound to penetrate into (and fill) the empty spaces between the electrically conductive portions of the leadframes 12.

Figure 4B:
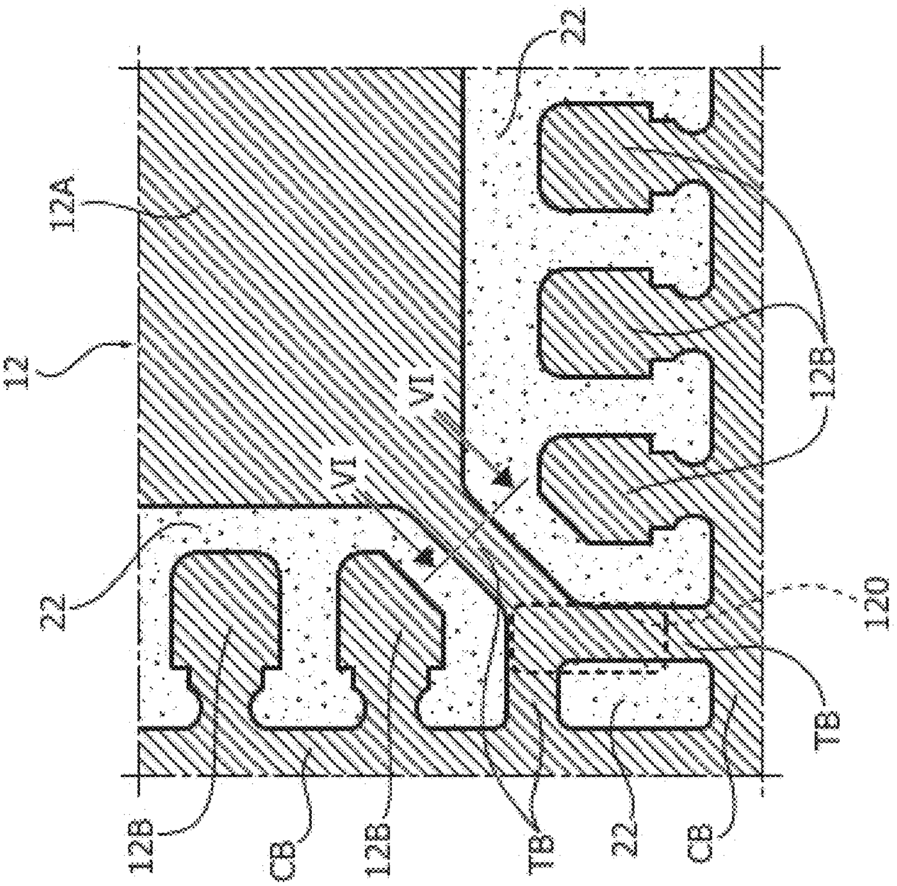
Figure 4A:
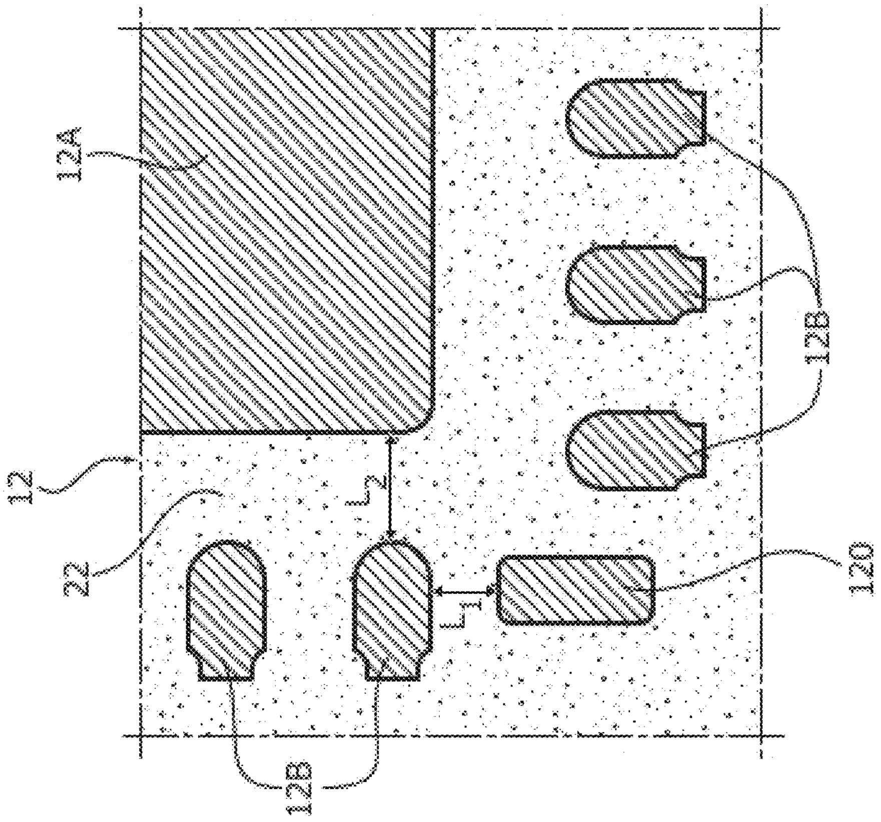

A pre-molded leadframe 12 obtained via the processing steps described in the foregoing is illustrated in FIGS. 4A and 5B.

The pre-molded leadframe 12 has two opposed surfaces: a first (top or front) surface, illustrated in FIG. 4B, configured to have one or more (integrated circuit) semiconductor dice mounted thereon (at the die pad 12A); and a second (bottom or back) surface, illustrated in FIG. 4A, configured to be soldered on a (final) substrate (a PCB, for instance).

Die pads 12A, leads 12B and dummy pads 120 are exposed (that is, left uncovered by the pre-molding compound) at the second (bottom) surface of the pre-molded leadframe 12 to facilitate soldering thereof to corresponding locations of a final substrate (such as a PCB), possibly facilitated by a solder paste provided on the corresponding locations of the final substrate.

As mentioned, dummy pads 120 are a desirable feature in IC semiconductor devices, especially for automotive applications, in so far as they provide additional solder joints for the devices, thus increasing reliability.

Dummy pads are exposed at the device package and are soldered to the board (a PCB, for instance) onto which the device is mounted.

If no dummy pads are provided, the package resin provides an external isolation.

If dummy pads are provided, the high number of leads 12B in the device and the relatively small dimensions of the device may result in a short distance (referenced with the reference L1 in FIG. 4A) between a dummy pad 120 and a lead 12B thus increasing the risk of electrical discharge therebetween when the device operates with high voltage differences. In fact, as visible in FIG. 4A, the distance L1 between a dummy pad 120 and a neighboring lead 12B can be shorter than L2, that is the distance between the lead 12B and a neighboring die pad 12A.

Such an electrical discharge may damage the device in so far as the dummy pads 120 are electrically coupled to the die pad 12A via the bars TB and an electrical discharge between dummy pads 120 and leads 12B would also affect the die pad 12A (and possibly the die mounted thereon) causing failure of the device.

A possible approach for reducing the risk of undesired electrical discharge could be to increase package size, thus increasing the distance between dummy pads 120 and leads 12B. However, such an approach may pose excessive constraints to package design, especially when small sized devices are desired.

Another approach could be to choose not to include dummy pads 120 in devices operating at high voltage differences thus renouncing to a desirable feature for enhanced soldering reliability.

Solutions as described herein may advantageously be applied to pre-molded leadframes 12 provided with dummy pads 120.

Solutions as described herein involve removing the electrical coupling between dummy pads 120 and die pads 12A, thus notionally eliminating issues related to electrical discharges between leads 12B and dummy pad 120.

Solutions as described herein involve removing a portion of the tie bar TB to decouple the dummy pad 120 from the die pad 12A.

In the following description, reference is made to a power IC semiconductor device having dummy pads 120 provided at the corner of the leadframe 12; as the person skilled in the art may appreciate this is merely exemplary in so far as: tie bars TB (and consequently dummy pads 120) may be located elsewhere than at the corner of a leadframe 12; and solutions as described herein may be advantageously applied to devices having a different structure than the power device exemplified herein.

Figure 5:
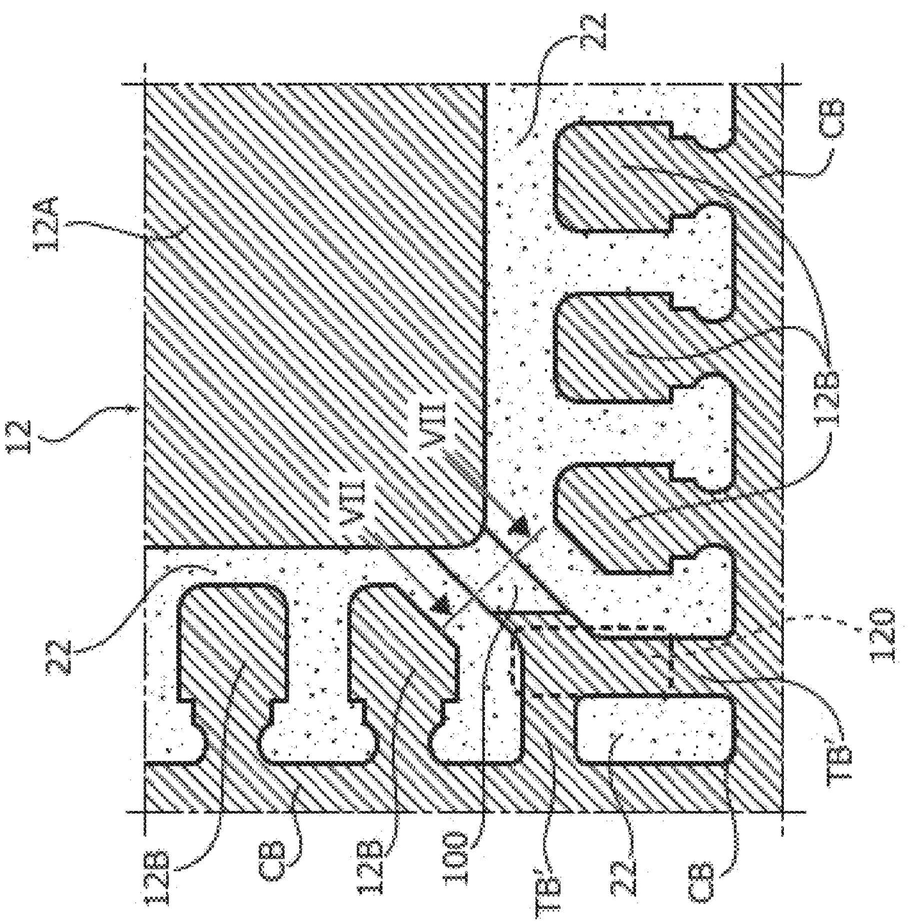
FIG. 5 is illustrative of a processing step according to embodiments of the present description.

FIG. 5 is a plan view of the first, top/front surface of a pre-molded leadframe 12 processed according to embodiments of the present description.

The dummy pads 120 are decoupled from the die pads 12A by removing the (electrically conductive) portion 100 of the tie bar TB connecting dummy pads 120 and die pads 12A.

Removing the tie bars TB may be limited to a portion 100 thereof, thus leaving residual portions of the tie bars, indicated with the references TB' in the figure, in the pre-molded leadframe 12.

The portion 100 of the tie bar TB may be removed via any method known to those skilled in the art. In some embodiments, a (second) etching step, oftentimes already envisaged in current assembly flow for other purposes, may advantageously be used also to remove the portion 100 of the tie bars TB.

In other embodiments, the portion 100 of the tie bars TB may be removed via laser ablation.

It is noted that the portion 100 of the tie bar TB is removed subsequently to the (pre-) molding step; in fact, as mentioned, tie bars TB, facilitate processing of pre-molded leadframes 12 by keeping flat and in position the portions of leadframe.

However performed, removing the portion 100 of electrically conductive material (a metal such as copper, for instance) of the tie bar TB forms a recessed portion (referenced with the same reference 100 for simplicity) in the (otherwise substantially flat) pre-molded leadframe 12.

The pre-molding insulating compound 22 is exposed at the bottom surface of the recessed portion 100 in response to the removing of the (half-etched) portion of the tie bar TB.

Figure 6:
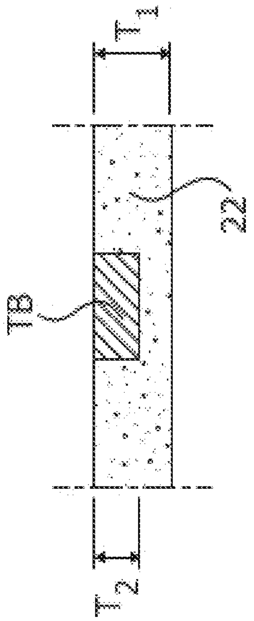
FIGS. 6 and 7 are cross sectional views along line VI-VI of FIG. 5B and line VII-VII of FIG. 6B, respectively.
Figure 7:
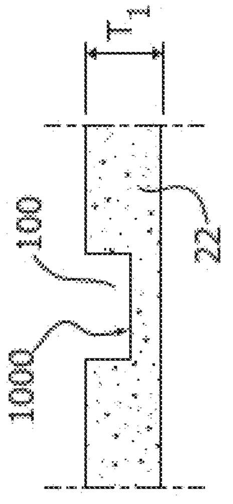

This is illustrated in FIGS. 6 and 7 that are cross sectional views along lines VI-VI and VII-VII of FIGS. 4B and 5, respectively.

As illustrated in FIG. 6, the pre-molded leadframe 12 has a "full" thickness T1 between the two opposed surfaces thereof, and the tie bar TB has thickness T2 less than (not necessarily half of) T1.

As illustrated in FIG. 7, removing a portion 100 of the tie bar TB causes the pre-molding insulating compound to be exposed at the bottom surface 1000 of the recessed portion 100.

In summary, a pre-molded leadframe 12 as described herein may be obtained via molding of an electrically insulating material 22 (an epoxy resin, for instance) onto a sculptured, electrically conductive leadframe structure comprising a pattern of electrically conductive formations (die pads 12A, leads 12B, tie bars TB and dummy pads 120).

The electrically conductive formations comprise a die mounting location 12A (a die pad, for instance) configured to have at least one semiconductor die arranged thereon, a dummy pad 120 and a tie bar TB extending between the die mounting location 12A and the dummy pad 120.

A pre-molded leadframe structure results from the electrically insulating material 20 penetrating into spaces between electrically conductive formations.

At least one portion of the tie bar 100 extending between the die mounting location 12A and the dummy pad 120 is removed to electrically decouple the dummy pad 120 from the die mounting location 12A.

Further processing of a pre-molded leadframe 12 as described in the foregoing to obtain finished devices 10 (as illustrated, for instance, in FIG. 1) may comprise: mounting/attaching one or more dice on corresponding mounting locations, that is the die pads 12A; providing the desired electrical couplings via wire bonding (coupling a microcontroller die to low-power leads and microcontroller die to power die, for instance) and/or via clip/ribbon bonding (coupling the power die the power leads, for instance); providing a protective, electrically insulating encapsulation via molding of a molding compound 20 (an epoxy resin, for instance, not necessarily of the same type of the pre-molding compound 22) onto the assembly; and singulating (via sawing with a blade, for instance) the leadframe reel/strip processed as described in the foregoing to obtain a plurality of individual (finished) devices 10.

It is noted that the final molding step fills the recessed portion 100 of the pre-molded leadframe 12 with the molding compound.

The claims are an integral part of the technical teaching provided in respect of the embodiments.

Without prejudice to the underlying principles, the details and embodiments may vary, even significantly, with respect to what has been described by way of example only without departing from the extent of protection. The extent of protection is determined by the annexed claims.

The invention claimed is:

1. A method, comprising:

molding electrically insulating material onto a sculptured, electrically conductive leadframe structure comprising a pattern of electrically conductive formations to form a pre-molded leadframe structure;

wherein the electrically conductive formations of the pattern comprise a die mounting location configured to have at least one semiconductor die arranged thereon, a dummy pad and a tie bar extending between the die mounting location and the dummy pad;

wherein the electrically insulating material penetrates into spaces between electrically conductive formations in the pattern of electrically conductive formations; and removing at least one portion of the tie bar extending between the die mounting location and the dummy pad to electrically decouple the dummy pad from the die mounting location.

2. The method of claim 1, further comprising removing at least one portion of the tie bar extending between the die mounting location and the dummy pad via laser ablation.

3. The method of claim 1, further comprising removing at least one portion of the tie bar extending between the die mounting location and the dummy pad via etching.

4. The method of claim 1, wherein:

the pre-molded leadframe structure has a first thickness between opposed first and second opposed surfaces; and the tie bar has a second thickness less than said first thickness and is left uncovered by the electrically insulating material at the first surface of the pre-molded leadframe structure.

5. The method of claim 4, wherein removing at least one portion of the tie bar extending between the die mounting location and the dummy pad results in a recessed portion being formed in the pre-molded leadframe structure.

6. The method of claim 5, further comprising:

mounting at least one semiconductor die on the corresponding die mounting location of the pre-molded leadframe structure; and molding a second electrically insulating material onto the pre-molded leadframe structure having the at least one semiconductor die mounted thereon;

wherein said second electrically insulating material penetrates into the recessed portion formed in the pre-molded leadframe structure.

7. A pre-molded leadframe, comprising:

a sculptured, electrically conductive leadframe structure comprising a pattern of electrically conductive formations, wherein the electrically conductive formations comprise a die mounting location configured to have at least one semiconductor die arranged thereon, a dummy pad and a tie bar extending between the die mounting location and the dummy pad;

electrically insulating material molded onto the sculptured, electrically conductive leadframe structure;

wherein the electrically insulating material penetrates into spaces between electrically conductive formations in the pattern of electrically conductive formations; and at least one gap in the tie bar extending between the die mounting location and the dummy pad to electrically decouple the dummy pad from the die mounting location.

8. The pre-molded leadframe of claim 7, wherein:

the pre-molded leadframe structure has a first thickness between opposed first and second opposed surfaces; and the tie bar has a second thickness less than said first thickness and is left uncovered by the electrically insulating material at the first surface of the pre-molded leadframe structure.

9. The pre-molded leadframe of claim 7, further comprising a recessed portion in the pre-molded leadframe structure at the location said at least one gap.

10. A semiconductor device, comprising:

the pre-molded leadframe according to claim 7, and at least one semiconductor die mounted at said die mounting location.

11. The semiconductor device according to claim 10, further comprising:

a recessed portion in the pre-molded leadframe structure at the location said at least one gap; and a second electrically insulating material molded onto the pre-molded leadframe structure having the at least one semiconductor die mounted thereon at said die mounting location, wherein said second electrically insulating material penetrates in the recessed portion in the pre-molded leadframe structure.

* * * * *